(12) United States Patent
Chen et al.

(10) Patent No.: US 9,992,904 B2
(45) Date of Patent: Jun. 5, 2018

(54) ELECTRONIC DEVICE ENCLOSURE WITH AN ACCESS MECHANISM

(71) Applicant: Quanta Computer Inc., Taoyuan (TW)

(72) Inventors: Chao-Jung Chen, Taoyuan (TW); Yaw-Tzorng Tsorng, Taoyuan (TW); Kun-Pei Liu, Taoyuan (TW); Tsung-Cheng Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days. days.

(21) Appl. No.: 15/097,649

(22) Filed: Apr. 13, 2016

(65) Prior Publication Data
US 2017/0094822 A1    Mar. 30, 2017

Related U.S. Application Data

(60) Provisional application No. 62/222,945, filed on Sep. 24, 2015.

(51) Int. Cl.
*H05K 7/14*    (2006.01)
*G06F 1/18*    (2006.01)
*G11B 33/12*    (2006.01)

(52) U.S. Cl.
CPC ........... *H05K 7/1489* (2013.01); *G06F 1/187* (2013.01); *G11B 33/128* (2013.01)

(58) Field of Classification Search
CPC .. H05K 7/1409; H05K 7/1408; H05K 7/1411; H05K 7/1401; H05K 5/0295; H05K 7/1489; G06F 1/187; G06F 1/184; G06F 1/181; G11B 33/124; G11B 33/128

USPC .............. 361/727, 754, 755, 679.57, 679.58; 439/160; 312/330.1, 334.1, 332.1
See application file for complete search history.

(56) References Cited

U.S. PATENT DOCUMENTS

| | | | | |
|---|---|---|---|---|
| 5,283,713 A | * | 2/1994 | Nagafuji | H01R 13/629 211/41.17 |
| 5,483,419 A | * | 1/1996 | Kaczeus, Sr. | G06F 13/4081 312/274 |
| 5,751,551 A | * | 5/1998 | Hileman | G11B 33/08 248/634 |
| 5,777,845 A | * | 7/1998 | Krum | G11B 33/08 206/592 |
| 6,017,230 A | * | 1/2000 | Yao | G11B 33/122 439/159 |
| 6,071,133 A | * | 6/2000 | Ho | G06K 13/08 439/159 |
| 6,084,768 A | * | 7/2000 | Bolognia | G06F 1/184 248/636 |

(Continued)

FOREIGN PATENT DOCUMENTS

TW     413381 U    11/2000

*Primary Examiner* — Hiwot E Tefera
(74) *Attorney, Agent, or Firm* — Nixon Peabody LLP; Eduardo J. Quinones; Zhou Lu

(57) ABSTRACT

A device enclosure includes a housing, a shaft, and a front panel. The housing defines a receiving bay configured to slidably receive an electronic device. The shaft is slidably mounted on a sidewall of said housing, includes a rear flange, and is slidable between a retracted position and a deployed position. The front panel is rotatably mounted on the shaft by a hinge and having a fulcrum projection and is rotatable between a closed position that closes a front of the receiving bay and a fully open position which extends away from the housing.

8 Claims, 5 Drawing Sheets

(56) References Cited

U.S. PATENT DOCUMENTS

| | | | | |
|---|---|---|---|---|
| 6,431,890 B1* | 8/2002 | Li | ............... | H01R 13/6335 |
| | | | | 439/160 |
| 7,203,949 B2* | 4/2007 | Shih | ............... | G06F 1/184 |
| | | | | 361/679.32 |
| 7,559,782 B2* | 7/2009 | Yuh | ............... | G11B 33/121 |
| | | | | 361/754 |
| 8,300,398 B2* | 10/2012 | Zhang | ............... | G06F 1/187 |
| | | | | 312/223.2 |
| 8,369,080 B2* | 2/2013 | Huang | ............... | G06F 1/187 |
| | | | | 361/679.37 |
| 8,385,076 B2* | 2/2013 | Peng | ............... | H05K 7/1401 |
| | | | | 248/200 |
| 8,705,230 B2* | 4/2014 | Wen | ............... | G11B 33/128 |
| | | | | 361/679.38 |
| 8,991,950 B2* | 3/2015 | Privitera | ............... | G06F 1/183 |
| | | | | 312/309 |
| 9,313,909 B1* | 4/2016 | Huang | ............... | G11B 33/128 |
| 9,398,715 B2* | 7/2016 | Nguyen | ............... | H05K 7/1409 |
| 2011/0299237 A1* | 12/2011 | Liang | ............... | G11B 33/128 |
| | | | | 361/679.38 |
| 2012/0218705 A1* | 8/2012 | Huang | ............... | G06F 1/187 |
| | | | | 361/679.37 |
| 2013/0069503 A1* | 3/2013 | Hu | ............... | G06F 1/187 |
| | | | | 312/223.2 |
| 2014/0211423 A1* | 7/2014 | Nguyen | ............... | H05K 7/1409 |
| | | | | 361/728 |
| 2014/0345105 A1* | 11/2014 | Brockett | ............... | G06F 1/187 |
| | | | | 29/428 |

* cited by examiner

ELECTRONIC DEVICE ENCLOSURE WITH AN ACCESS MECHANISM

CROSS REFERENCE TO RELATED APPLICATIONS

This application claims priority to U.S. Provisional Application No. 62/222,945 entitled "The mechanism of bare HDD ejector with pull tab", filed on Sep. 24, 2015, the contents of which are expressly incorporated by reference in its entirety.

FIELD OF INVENTION

This application relates to computer systems, and more particularly to an electronic device enclosure with an access mechanism.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (IO) cables, network cables, power cables, etc., connect to the computing modules at the front or rear of the rack. Each computing module contains one or more computer servers or may hold one or more computer server components. For example computing modules includes hardware circuitry for processing, storage, network controllers, disk drives, cable ports, power supplies, etc.

For instance, many peripherals such as hard disk drives are rack-mounted. Rack-mounted peripherals have a standard width that enables them to be inserted into industry-standard racks. Racks allow a large number of rack-mounted peripherals to be inserted into a single rack.

Existing hard disk enclosure blades are rack-mounted peripherals that accept a number of trays of hard disk drives. For instance, one type of hard disk enclosure blade accepts eight trays. Each tray may hold three hard disk drives, such that the hard disk enclosure itself can store a total of twenty-four hard disk drives.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a device enclosure includes a housing, a shaft, and a front panel. The housing defines a receiving bay configured to slidably receive an electronic device. The shaft is slidably mounted on a sidewall of said housing, the shaft having a rear flange, the shaft being slidable between a retracted position and a deployed position. The front panel is rotatably mounted on the shaft by a hinge and having a fulcrum projection, the front panel being rotatable between a closed position that closes a front of the receiving bay and a fully open position which extends away from the housing. In response to the front panel moving from the closed position to the fully open position, the fulcrum projection engages the housing such that the hinge moves away from the housing and the shaft moves to the deployed position. In response to rearward pressure on the rear flange of the shaft by the electronic device, the shaft moves to the retracted position, the hinge moves toward the housing, and engagement of the fulcrum projection and the housing rotates the front panel from the fully open position to a partially open position.

In some implementations, a method for mounting an electronic device into a device enclosure includes rotating a front panel of a housing to a fully open position and inserting the electronic device into receiving bay defined by the housing. The front panel is rotatable between a closed position that closes a front of the receiving bay and the fully open position which extends away from the housing. The electronic device is then pushed against a rear flange of a shaft slidably mounted on a sidewall of the housing. The shaft is slidable between a retracted position and a deployed position, the a front panel being rotatably mounted on the shaft by a hinge and having a fulcrum projection. In response to rearward pressure on the rear flange of the shaft by the electronic device, the shaft moves to the retracted position, the hinge moves toward the housing, and engagement of the fulcrum projection and the housing rotates the front panel from the fully open position to a partially open position. The front panel is then rotated to the closed position.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides an electronic device enclosure with an access mechanism. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

The subject disclosure provides an electronic device enclosure with an access mechanism that allows for a more economical solution for storing one or more electronic devices. The device enclosure does not require trays for each individual electronic device which saves both cost and complexity. The device enclosure also allows each electronic device to be easily inserted or removed from the device enclosure without the use of trays.

Figure 1:
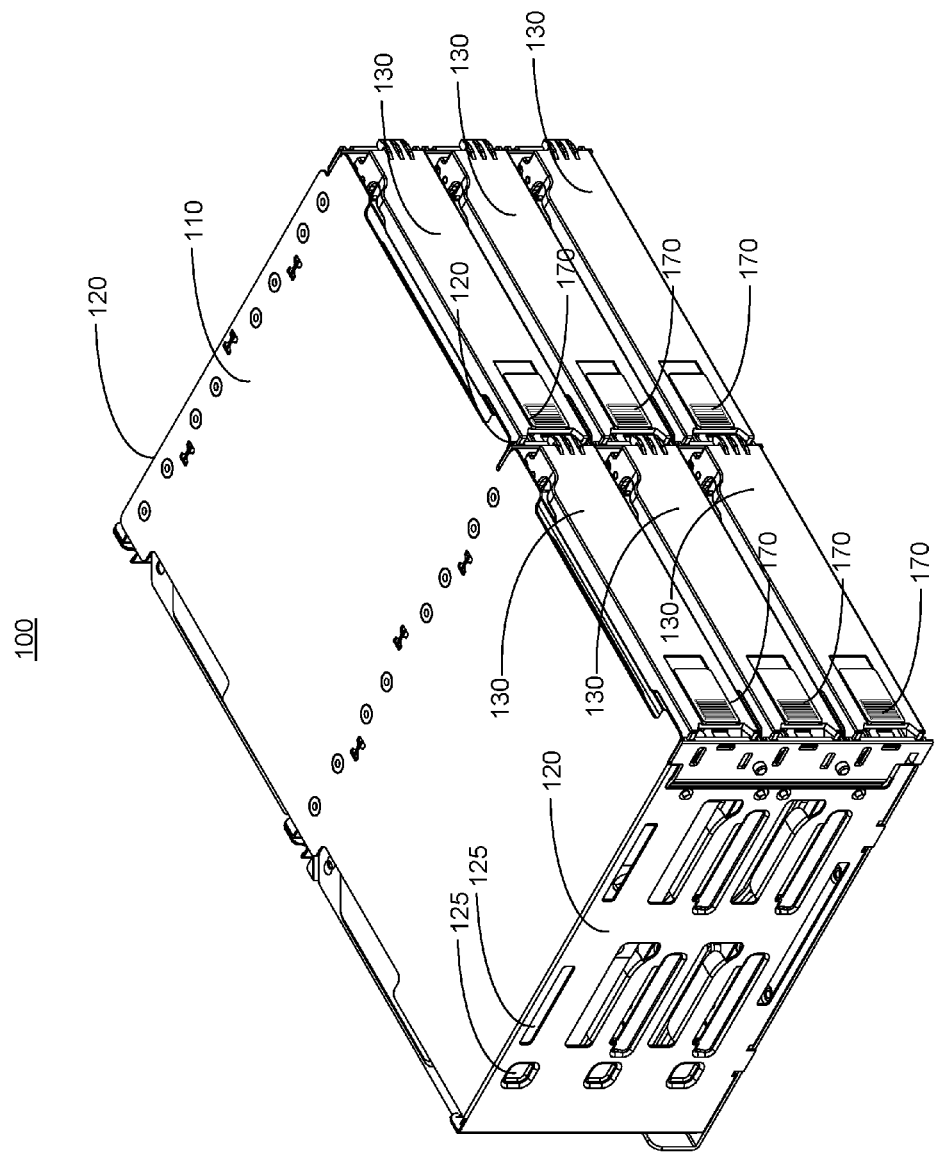
FIG. 1 illustrates a front three quarter view of an example electronic device enclosure with front panels closed.

FIG. 1 illustrates a front three quarter view of an example electronic device enclosure 100 with front panels closed. The electronic device enclosure 100 includes a housing 110. In some aspects, the housing 110 is rectangular box shaped. The housing 110 can be constructed of any suitable material such as metal, plastic, composites, etc. The electronic devices to be fit into the housing 110 can include hard disk drives (HDD), solid state drives (SSD), or any other electronic device.

In the example electronic device enclosure 100 shown in FIG. 1, six receiving bays are defined by the housing 110. However, it is noted that any number of receiving bays can be conceivably defined by the housing 110. Each receiving bay is configured to slidably receive one electronic device. Each receiving bay is matched to a front panel 130 that functions as an entry which can be rotated opened or closed to allow insertion or removal of the electronic device.

The housing 110 includes a number of side walls 120, which are vertical panels that span from front to back of the housing and help provide structural support to the housing 110. In the example electronic device enclosure 100 shown in FIG. 1, a number of side walls 120 are located on a left side, middle (hidden), and right side of the housing 110, respectively. In some aspects, the side walls 120 include one or more cutouts and/or vents 125 to save material costs and improve airflow through the housing 110.

Each front panel 130 includes a latch 170 that holds the front panel in the closed position. The latch 170 can be any latch or fastener mechanism known in the art. In some aspects, the latch 170 can include a spring for allowing a user to release the latch 170.

Figure 2:
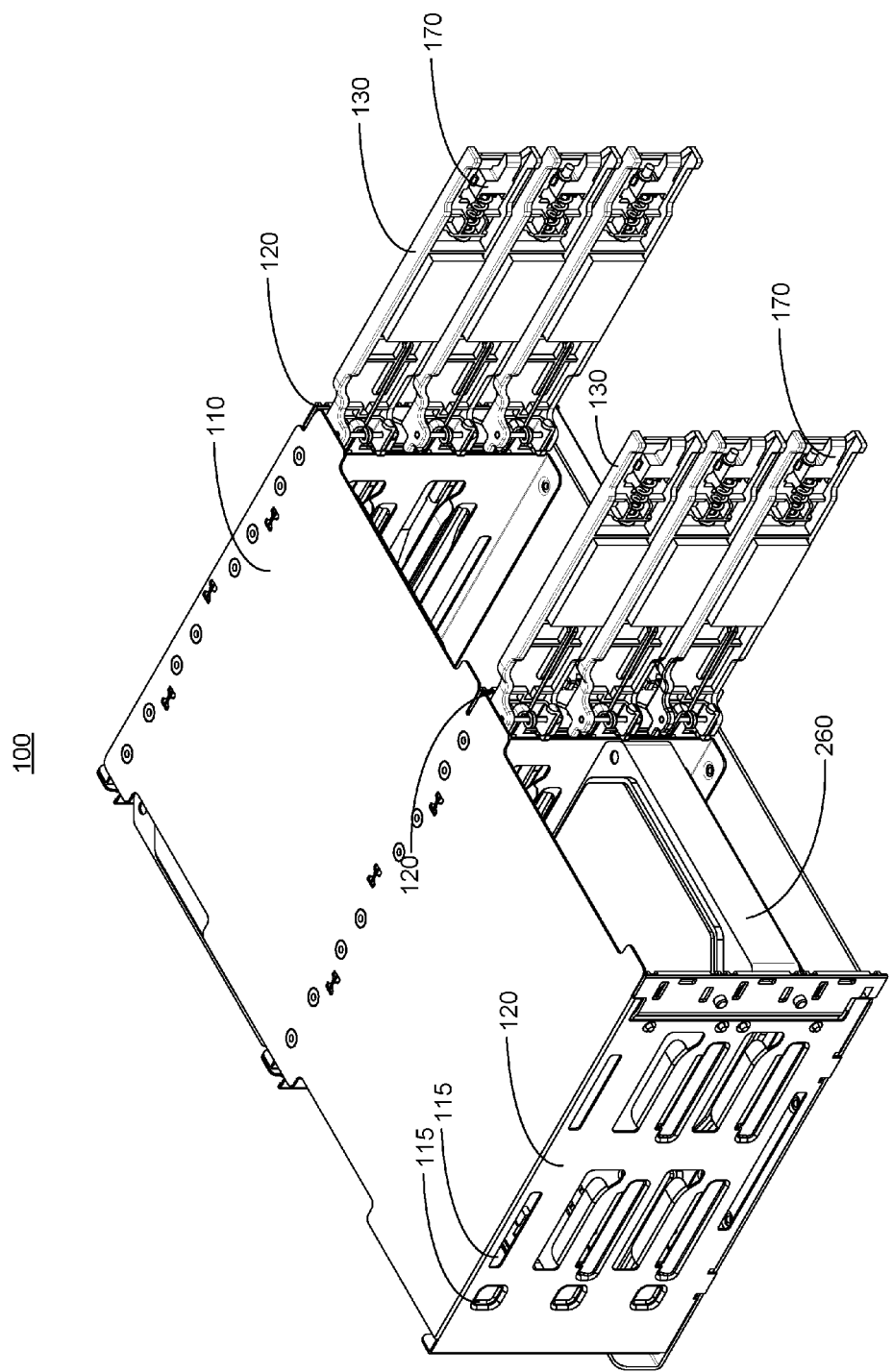
FIG. 2 illustrates a front three quarter view of the example electronic device enclosure of FIG. 1 with front panels open.

FIG. 2 illustrates a front three quarter view of the example electronic device enclosure 100 of FIG. 1 with front panels open. In the example electronic device enclosure 100 shown in FIGS. 1 and 2, six receiving bays are defined by the housing 110.

Each receiving bay is configured to slidably receive one electronic device 260 (only one electronic device 260 is shown in the example of FIG. 2). Each receiving bay is matched to a front panel 130 that functions as an entry which can be rotated opened or closed to allow insertion or removal of the electronic device 260.

Each receiving bay is matched to two side walls 120. The electronic device 260 is slidably mounted between the two side walls 120 of each receiving bay.

Figure 3:
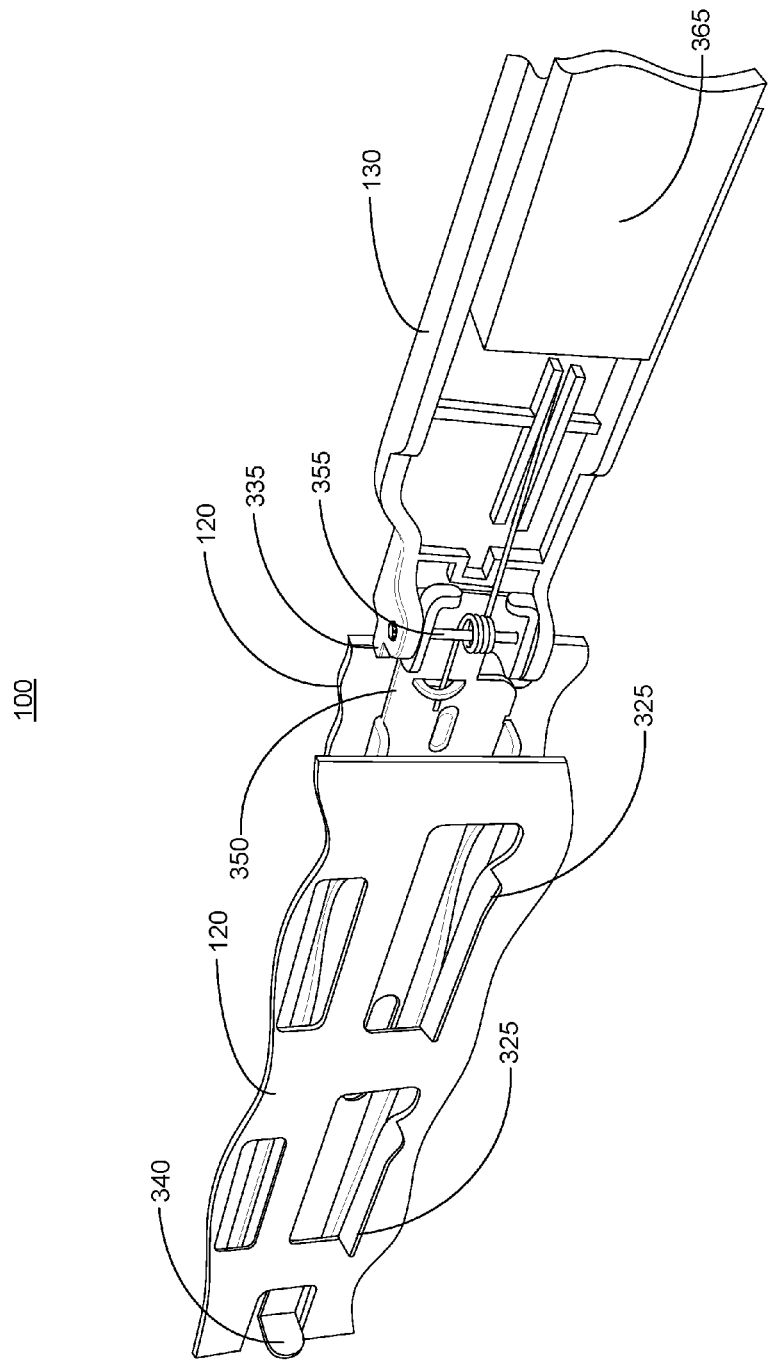
FIG. 3 illustrates a close-up view of a hinge area of the example electronic device enclosure of FIG. 1.

FIG. 3 illustrates a close-up view of a hinge area of the example electronic device enclosure 100 of FIG. 1. Each receiving bay includes a shaft 350 slidably against side walls 120 of the housing 110. The front panel 130 is attached to the shaft by a hinge 355.

An electronic device can slide between two side walls 120. In some aspects, the side walls 120 include support tabs 325 which support the electronic device, and to allow the electronic device 260 to slide in or out of each receiving bay.

The shaft 350 is slidable between a retracted position (i.e., towards a rear of the housing 110) and a deployed position (i.e., towards a front of the housing 110). The hinge 355 allows the front panel 130 to rotate about the hinge 355 relative to the side wall 120 between a fully open position and a closed position.

The shaft includes a rear flange 340, of which the electronic device 260 can press against. When a user inserts the electronic device 260 fully into the receiving bay, the electronic device 260 presses against the rear flange 340 to move the shaft 350 from the deployed position to the retracted position. In the reverse direction, moving the shaft 350 from the retracted position to the deployed position will cause the rear flange 340 to pull a fully inserted electronic device 260 outward from the receiving bay.

The front panel 130 includes a fulcrum projection 335, located on an opposite end to the latch 170. When a user rotates the front panel 130 from the closed position to the fully open position, the fulcrum projection 335 engages (i.e., pushes against) the side wall 120 of the housing 110 such that the hinge 355 moves away from the housing 110 and the shaft 350 moves to the deployed position.

When a user inserts the electronic device 260 fully into the receiving bay, rearward pressure on the rear flange 340 of the shaft 350 by the electronic device 260 causes the hinge 355 to move toward the housing 110 (i.e., rearward). The shaft 350, attached to the hinge 355, moves to the retracted position from the deployed position. Engagement of the fulcrum projection 335 and the housing 110 rotates the front panel 130 from the fully open position to a partially open position.

In some aspects, the front panel 130 includes a padding 365 mounted on an interior side of the front panel 130. The padding 365 presses against the electronic device 260 when the front panel 130 is in the closed position, to prevent the electronic device 260 from moving.

Figure 4:
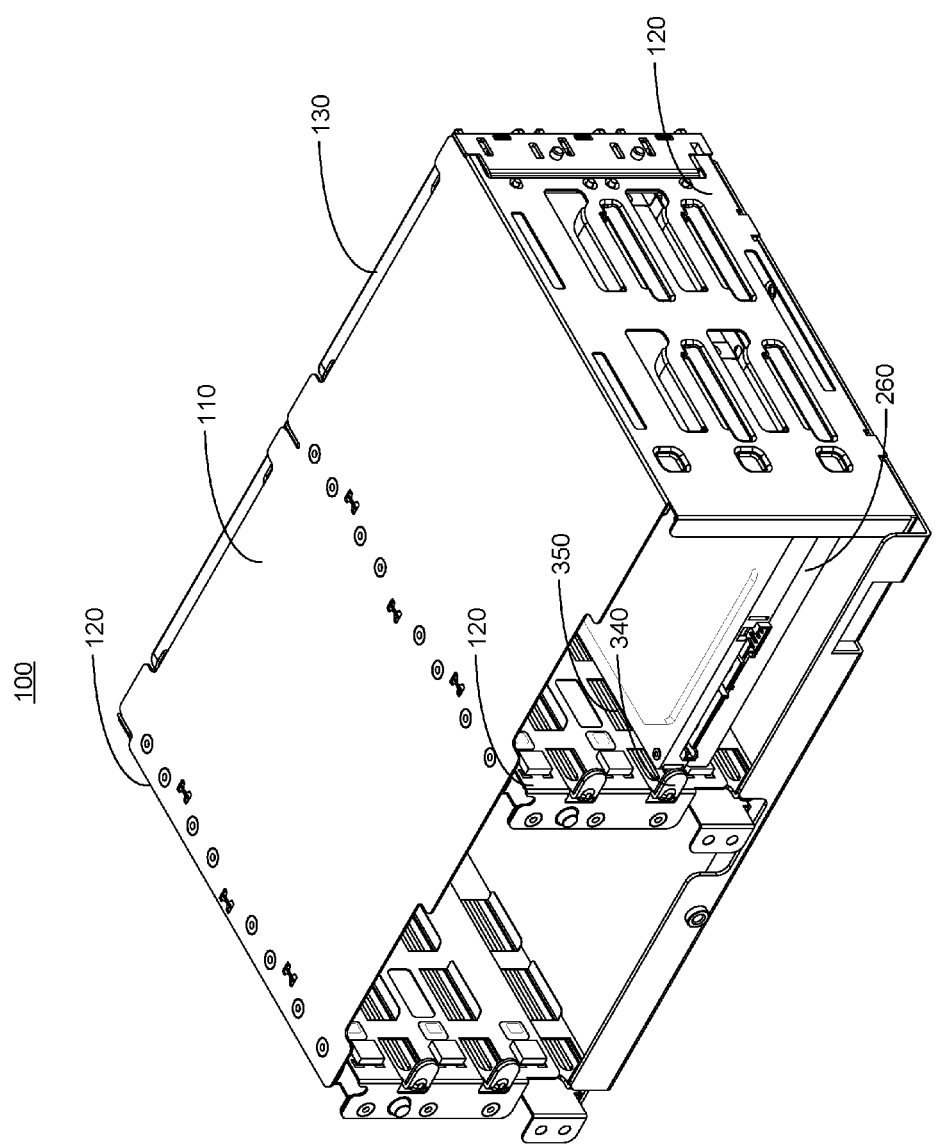
FIG. 4 illustrates a rear three quarter view of the example electronic device enclosure of FIG. 1.

FIG. 4 illustrates a rear three quarter view of the example electronic device enclosure 100 of FIG. 1. FIG. 4 shows the front panels 130 in the closed position and the electronic device 260 fully inserted into a receiving bay of the housing 110. The rear flange 340 is pressed against a rear of the peripheral device 260. The shaft 350 is at the retracted position.

Rotating the front panel 130 corresponding to the receiving bay holding the electronic device 260 will pull the shaft 350 and the attached rear flange 340 from the retracted position to the deployed position. The rear flange 340, in turn, pulls the electronic device 260 outward from the receiving bay.

Figure 5:
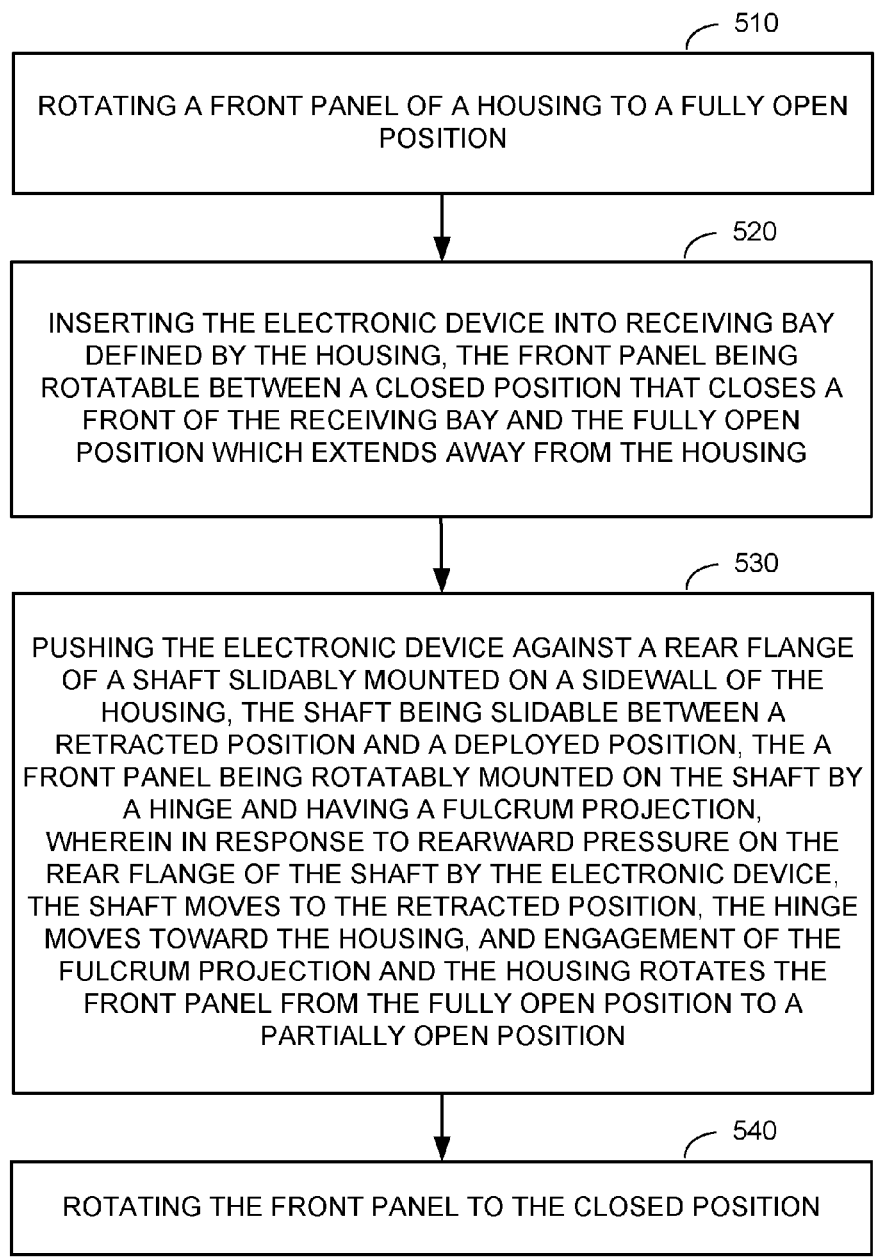
FIG. 5 illustrates an example methodology for mounting an electronic device into a device enclosure.

FIG. 5 illustrates an example methodology for mounting an electronic device into a device enclosure. At step 510, a user rotates a front panel of a housing to a fully open position.

At step 520, the user inserts the electronic device into receiving bay defined by the housing, the front panel being rotatable between a closed position that closes a front of the receiving bay and the fully open position which extends away from the housing.

At step 530, the user pushes the electronic device against a rear flange of a shaft slidably mounted on a sidewall of the housing, the shaft being slidable between a retracted position and a deployed position, the a front panel being rotatably mounted on the shaft by a hinge and having a fulcrum projection.

Rearward pressure on the rear flange of the shaft by the electronic device causes the shaft to move to the retracted position, the hinge moves toward the housing, and engagement of the fulcrum projection and the housing rotates the front panel from the fully open position to a partially open position.

At step 540, the user rotates the front panel to the closed position.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor is a microprocessor, or in the alternative, any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor reads information from, and write information to, the storage medium. In the alternative, the storage medium is integral to the processor. The processor and the storage medium resides in an ASIC. The ASIC resides in a user terminal. In the alternative, the processor and the storage medium resides as discrete components in a user terminal.

In one or more exemplary designs, the functions described is implemented in hardware, software, firmware, or any combination thereof. If implemented in software, the functions are stored on or transmitted over as one or more instructions or code on a non-transitory computer-readable medium. Non-transitory computer-readable media includes both computer storage media and communication media including any medium that facilitates transfer of a computer program from one place to another. A storage media is any available media that can be accessed by a general purpose or special purpose computer. By way of example, and not limitation, such computer-readable media includes RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A device enclosure, comprising:
   a housing defining a receiving bay configured to slidably receive an electronic device, the housing comprising a plurality of side walls, each of the plurality of side walls including at least one vent configured to improve airflow through the housing;
   a shaft slidably mounted on a sidewall of the housing, the shaft having a rear flange, the shaft being slidable between a retracted position and a deployed position;
   a front panel rotatably mounted on the shaft by a vertically-disposed hinge, and the front panel having a fulcrum projection, the front panel being rotatable between a closed position that closes a front of the receiving bay and a fully open position which extends away from the housing;
   a spring mechanism positioned on the hinge, a first end of the spring mechanism being positioned against the front panel, a second end of the spring mechanism being positioned against the shaft; and
   a lock latch mounted on the front panel, the lock latch configured to hold the front panel in the closed position until operated to release the front panel, the lock latch including a spring operable to allow a user to release the lock latch;
   wherein in response to the front panel moving from the closed position to the fully open position, the fulcrum projection pushes against the sidewall such that the hinge moves away from the housing and the shaft moves to the deployed position;
   wherein in response to rearward pressure on the rear flange of the shaft by the electronic device, the shaft moves to the retracted position, the hinge moves toward the housing, and engagement of the fulcrum projection and the housing rotates the front panel from the fully open position to a partially open position.

2. The device enclosure of claim 1, further comprising a padding mounted on the front panel, the padding configured to press against the device when the front panel is in the closed position, to prevent the device from moving.

3. The device enclosure of claim 1, wherein the spring mechanism positioned on the hinge has a predisposition to rotate the front panel from the closed position towards the fully open position.

4. The device enclosure of claim 1, wherein the device enclosure is configured to slidably receive at least one additional electronic device, and comprises an additional shaft and an additional front panel for each of the additional electronic device.

5. The device enclosure of claim 1, further comprising support tabs mounted on the housing, the support tabs configured to support the electronic device, and to allow the electronic device to slide in or out of the housing.

6. The device enclosure of claim 1, wherein in response to the front panel moving from the closed position to the fully open position, the hinge moves away from the housing and the rear flange presses the electronic device away from the housing.

7. A method for mounting an electronic device into a device enclosure, comprising:
   rotating a front panel of a housing to a fully open position, the housing comprising a plurality of side walls, each of the plurality of side walls including at least one vent configured to improve airflow through the housing;
   inserting the electronic device into receiving bay defined by the housing, the front panel being rotatable between a closed position that closes a front of the receiving bay and the fully open position which extends away from the housing;
   pushing the electronic device against a rear flange of a shaft slidably mounted on a sidewall of the housing, the shaft being slidable between a retracted position and a deployed position, the front panel being rotatably mounted on the shaft by a vertically-disposed hinge, and the front panel having a fulcrum projection, wherein the device enclosure comprises a spring mechanism positioned on the hinge, a first end of the spring mechanism being positioned against the front panel, a second end of the spring mechanism being positioned against the shaft, and a lock latch mounted on the front panel, the lock latch configured to hold the front panel in the closed position until operated to release the front panel, the lock latch including a spring operable to allow a user to release the lock latch;

wherein in response to rearward pressure on the rear flange of the shaft by the electronic device, the shaft moves to the retracted position, the hinge moves toward the housing, and engagement of the fulcrum projection and the housing rotates the front panel from the fully open position to a partially open position; and rotating the front panel to the closed position, wherein in response to the front panel moving from the closed position to the fully open position the fulcrum projection pushes against the sidewall such that the hinge moves away from the housing and the shaft moves to the deployed position.

8. The method of claim 7, further comprising rotating the front panel to the fully open position.

* * * * *